United States Patent [19]
Pryor

[11] Patent Number: 4,740,812
[45] Date of Patent: Apr. 26, 1988

[54] SINGLE CHANNEL MASKING CAMERA & PROJECTOR

[76] Inventor: Paul A. Pryor, 10 Lonsdale Ave., Dayton, Ohio 45419

[21] Appl. No.: 802,238

[22] Filed: Nov. 27, 1985

[51] Int. Cl.$^4$ ............................................. G03B 27/32
[52] U.S. Cl. ........................................ 355/77; 355/43
[58] Field of Search ..................................... 355/77, 43

[56] References Cited

U.S. PATENT DOCUMENTS

| | | | |
|---|---|---|---|
| 1,808,743 | 6/1931 | Barkelew | 355/77 |
| 2,234,278 | 10/1941 | Richter . | |
| 2,354,108 | 7/1944 | Fleming . | |
| 2,407,211 | 9/1946 | Yule | 355/77 |
| 2,420,636 | 5/1947 | Yule | 355/77 |
| 2,754,208 | 7/1956 | Conrad | 355/77 |
| 3,085,469 | 4/1963 | Carlson | 355/37 |
| 3,185,026 | 5/1965 | Carlson et al. | 355/66 |
| 3,480,365 | 11/1969 | Ooue et al. | 355/77 |
| 3,912,361 | 10/1975 | Bentley . | |
| 4,422,753 | 12/1983 | Pryor | 355/43 |

*Primary Examiner*—Monroe H. Hayes
*Attorney, Agent, or Firm*—Carl A. Stickel

[57] ABSTRACT

An optical imaging system for producing and applying image masks consisting of an original object holder, an image forming optical system, recording means for the image formed, processing means for the recorded image, means for maintaining the recorded image in precise register with the original object. The recorded image is projected back on the original in a modified form by means of adding and controlling optical flare in the imaging system to control image contract and by well known means control image color and sharpness. This modified projected image in register with the original objects acts as a mask for image enhancement. The resulting enhanced image can then be recorded by photographic film or paper and other ray recording devices.

6 Claims, 3 Drawing Sheets

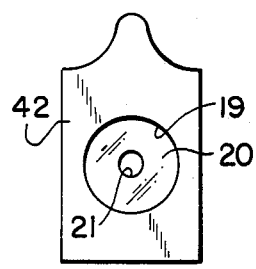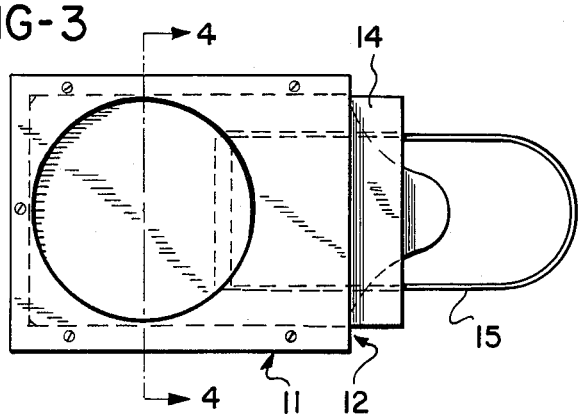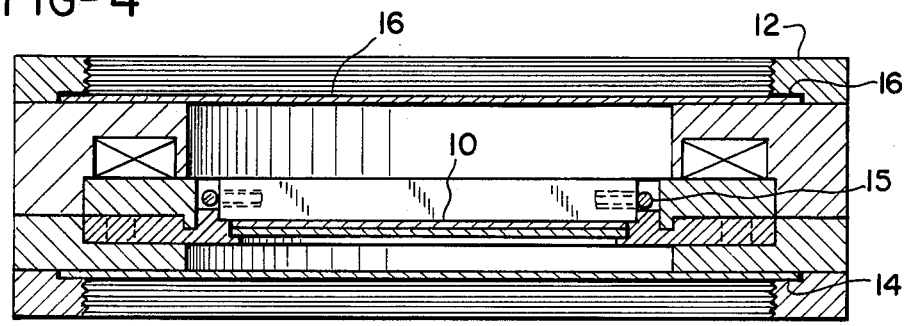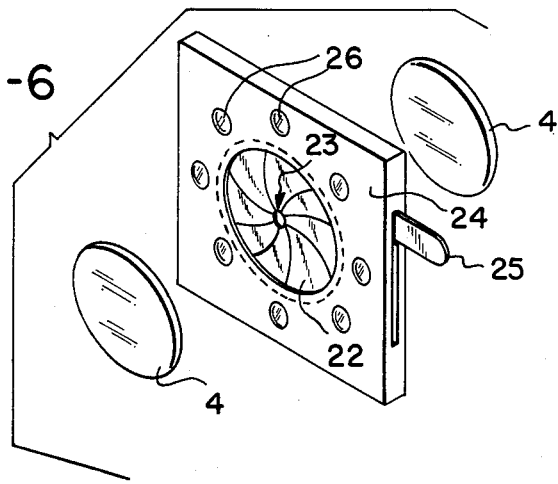

ously high cost of multichannel masking systems now becomes available at a very low cost. The glass plates 7 used to control the sharpness of the images are at a small angle to the optical axis to prevent their specular reflections from returning to the original image 1 being modified. However, since the final image is recorded by reimaging 1 and 2 with element 6 it is a minor concern if any. The flare or veiling glare control is of greater importance and is discussed below.

Figure 1:
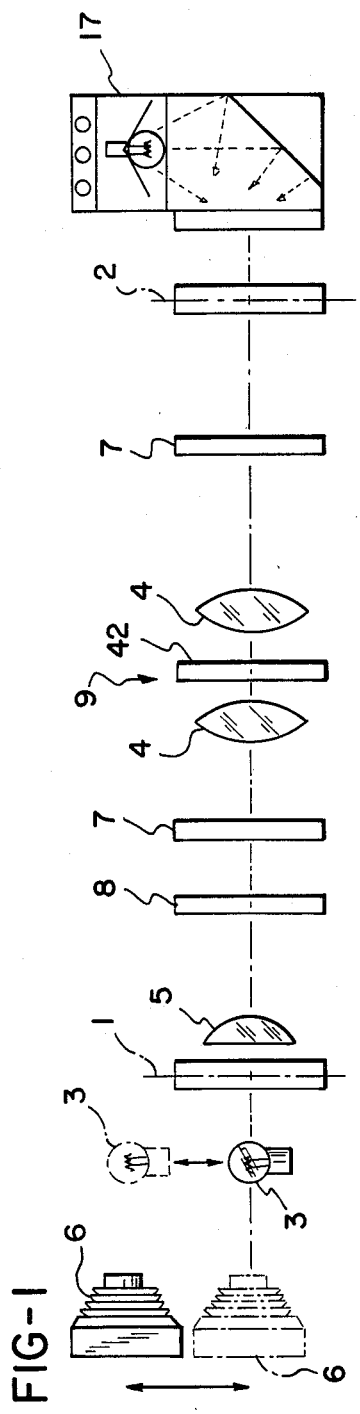

Flare is normally developed in lens systems by the scattering of light in the system by reflections from lens surfaces, reflection from lens mounting parts, and also by the scatter of light from imperfections in the glass, such as bubbles, dirt and irregularities in the glass and glass surfaces, especially the ground edges. Flare control is frequently accomplished by the use of "bloomed" lenses which have a special thin film coating on the surfaces which reduces the reflection, and by the use of diaphragms and screens to prevent reflections from the mounting surfaces from reaching the film. In this invention we have added additional flare to the optical system to accomplish certain effects desired such as improved modulation in the mid-density ranges of the original image and modification of the masking image applied to the original image. In a photographic system to reduce the flare component of the light going through the optical system in general, an added screen or diffuser 9 is added to the system near the stop of the optical system between image plane 1 and 2 as shown in FIG. 1. This component can provide a controlled amount of flare. It can consist of a piece of "frosted" glass or plastic, or plastic with a pattern printed on it, similar to a ground glass focusing screen.

Figure 2:
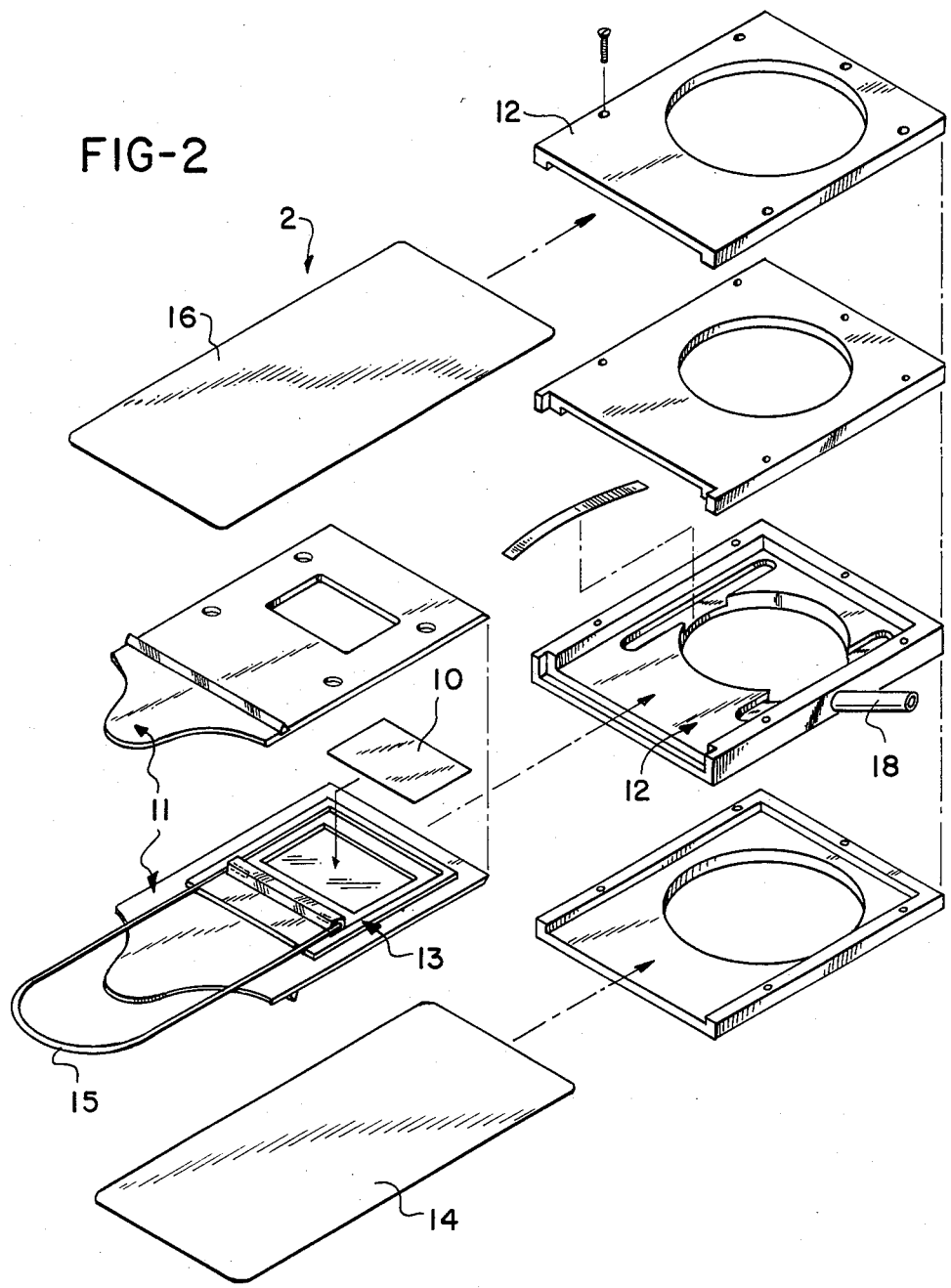

Referring to FIG. 2 we note that this is an exploded view of a film holder with glass plates on each side of the film and an additional liquid in contact with the emulsion of the film. Two items are new, (1) a non-hardening developer in contact with the emulsion and (2) a translucent, light diffusing surface 21, on plate 18. The bottom of the film holder could be transparent glass 19, ground glass, opal glass, or other translucent or transparent materials depending on the result desired. The glass plates 19 and 18 both could be translucent when the film holder is used as a projection screen in a masking camera enlarger or copier. Film 20 is held in place by being pressed between these plates by means of clamps, springs or fluid pressure not shown. Film 20 is processed by being in contact with a non-hardening developer solution 17 so that the original image can be combined with a mask produced in the film 20 which can be used to modify the image which it combines with. This method of "In-Situ" development allows the user to develop the masking film 20 without removing it from the camera. This saves both time and materials in the production of controlled images. The fluid which is introduced into the space between the film and plate 18 can be introduced by capillary action, pressure, or other means not shown, and it can be removed in a similar manner and rinsed with a water solution as needed. This system combined with proper exposure controls and timing allows masks to be produced with less skill and time than usual because the film is never moved from its original position during the exposure to its final use. It can be copied or used in-situ or "In place".

FIG. 3 is a plan view of the film holder in FIG. 2 and FIG. 4 is a cross section of FIG. 3 at 4—4.

FIG. 5 illustrates an alternate means for introducing flare or veiling glare to the image in a controlled manner. Namely, a glass plate 10 with an opaque or semi opaque mask 11 on the center of the glass is placed at or near the position of the stop of the imaging optical system between 1 and 2 in FIG. 1. Mask 11 is circular and of a size approximately that of the image of the filament or source of the illumination system 3. This acts to cause the light from source 3 to produce an image on the film and glass plates 7 which can cause a scattering of the light reaching the film 2 when it is being exposed, which then exposes the film to a uniform background of light over the entire area of the film. This "flare" light will reduce the contrast of the image reaching 2. However when the light is scattered and redirected by an image at 1 the flare produced is modified in accordance with the image so that the modifications in the light directed to 2 is caused by the light transmitted by the image at 1. This redirected light will expose those portions of the image at 2 most which corresponds to those areas of the image at 1 which are most transparent. Those areas of the image at 2 which are most exposed (dense) will be those areas which correspond to the most transparent areas of the image at 1. Thus an added control of the relation of the image at 2 to that at 1 is accomplished. The flare control by introduction of a mask 11 in the optical path at a position as described above works fine until the density of the mask 11 approaches that which prevents most of the direct image forming light of the system from reaching the image 2 to be modified. At this point it is necessary to expose 2 by another means. FIG. 6 shows how this can be accomplished by making mask 11 in the form of a total reflector such as a metal mirror which is tilted at an angle to the optical axis so that another light source 12 can direct its light through pinhole 13 to be reflected by 11 to act as a replacement of source 3 to take the place of the direct light beam of the original optical system. This source can be made larger or smaller as desired by control of the size of the pinhole 13 or by means of a lens 14 to image the pinhole at 11. By this means both the amount of direct light and its ratio to the flare producing light can be controlled at will to modify the final image formed at 2. Since light source 12 is positioned outside of the imaging light beam it does not interfere with it except at 11 which replaces mask 11 in FIG. 5 as the light source for final exposure of the image being formed at 2.

Figure 7:
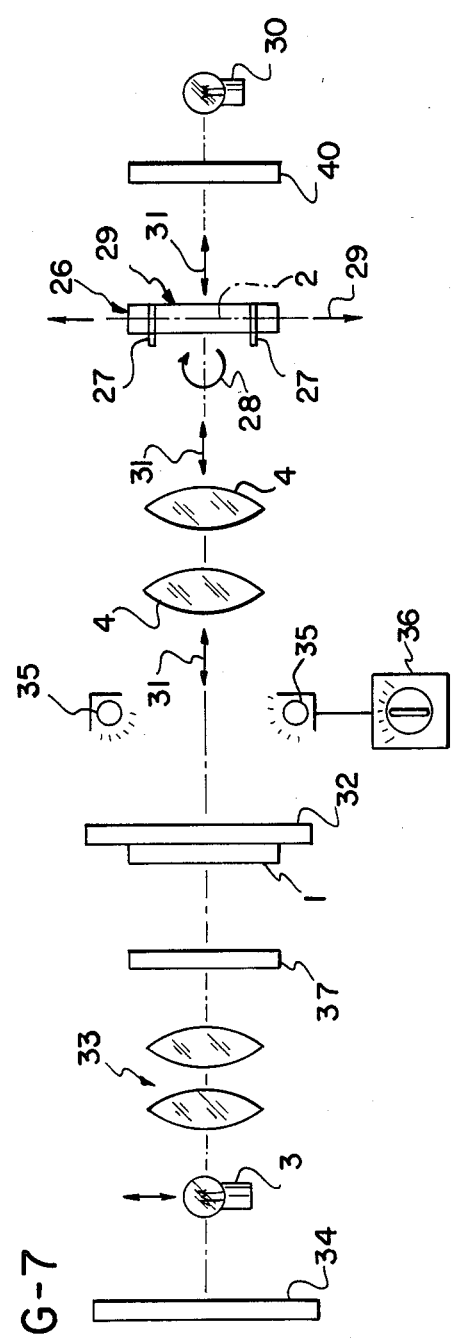

FIG. 7 is an alternate embodiment of the invention in which element 31 at 1 represents the transparency to be masked. Location 32 represents the location of the masking film. 33, 34, 35, 36, 37, and 38 represent elements of the imaging optical control the contrast of the mask produced at 1 by imaging the recorded image at 2.

The image at 2 can be recorded on a transparent photo sensitive material when the image at 1 is illuminated by light 3 and allowed to expose this photo sensitive material.

One way of insuring registration of the recorded image formed at 2 with the original image at 1 is to not move the photo sensitive material after exposure at 2. This requires "in situ" development. One method of "in situ" development is discussed in U.S. Pat. Nos. 3,085,469 and 3,185,026 which utilizes, and is developed by radiant energy of a frequency different from the frequency at which it was exposed.

Another method of "in situ" development is illustrated in FIGS. 2, 3 and 4, which utilizes a film holder similar to the one described in my invention U.S. Pat. No. 4,422,753 with the addition of a developer applicator. This "in situ" development film holder is used at 2 FIG. 1. In FIGS. 2, 3 and 4 the light sensitive material 10 is placed in holder 11 and inserted into the focal position through slot 12. Before inserting the holder in slot 12 a monobath developer in a viscose form is placed along one edge of the sensitized material at 13, in FIG. 2. The dark slide 14 is removed, the material exposed (by means of light 3 FIG. 1). The dark slide 14, is inserted and applicator 15 either a brush, sponge, or doctor blade spreads the monobath over the photo material when pushed or pulled. Development and fixation take place in this dark box like film holder. Upon completion of development both dark slides 14 and 16 are removed and the exposed and processed transparency is ready for use as a mask. It is projected in register with the original at 1 FIG. 1 when illuminated by light source 17 in FIG. 1.

Light source 17, in FIG. 1, represents a well known color controlled dichroic lamp house.

Other more unconventional photo processes can be used with "in situ" development. Heat processes such as Kalvar or 3M dry silver can be processed by substituting a heated roller for the applicator 15 or using heater elements or hot air through a tube 18 in the film holder FIG. 2. Pressure processed materials such as those using incapsulated developers can be processed by using a pressure roller instead of applicator 15. Gas processed material such as Diazo can be processed by inserting gas into the film holder through a tube such as 18 FIG. 2.

Optical flare or vieling glare can be introduced into the system to lower the contrast of the projected image of 2 at 1 in a number of ways. One way is by means of a light diffusing filter inserted in the optical system anywhere between 1 and 2. A series of filters of different degrees of diffusion could control the degree of flare.

FIG. 5 illustrates an alternate method of producing a controlled amount of optical flare in the image forming optical system of FIG. 1. At the aperture stop of the lense 4 such as where an iris diaphragm is usually situated in a photo type lens, approximately at position 9 FIG. 1 a device like a "Water House Stop" FIG. 5 is inserted. This flare control device is an opaque insert 42 (See FIGS. 1 and 5) and contains an aperature 19 corresponding in size to the maximum diameter of the aperture in lens 4 FIG. 1. Covering this aperature is a difuse translucent (light scattering) material 20 with a smaller aperature 21 in it. This insert 42 when inserted in lens 4 FIG. 1 will scatter the light through lens 4 in proportion to the area of the light scattering diffuser 20 exposed at the aperature. The size of the hole can be varied with different inserts and thus control the amount of scatter and thereby control the flare or vieling glare in the optical system of FIG. 1.

FIG. 6 illustrates two continuously variable means for adjusting the amount of vieling glare or flare introduced into the optical system at 4 FIG. 1. One method is to utilize an iris diaphragm constructed of translucent light scattering material 22. The amount of diffusing material exposed at the aperature 23 determines the degree of scattering. No scattering is introduced into the optical system when the leaves are opened all the way and covered by aperature plate 24. The translucent iris is controlled by lever 25.

Instead of a translucent variable diaphragm as shown in FIG. 6 controlled means of flare can be introduced, at 42 FIG. 1 and FIG. 6 by means of a series of holes 26 around the aperature 23. These holes are covered with a translucent light scattering material and lie within the optical path but outside the region of best optical correction. A control lever 25 controls a sliding cover for these holes. Thus the degree of flare introduced into the optical systems is controlled. This method is similar to the way in which aberrations are introduced in controlled amounts to produce the well known variable soft focus lens. Other means of flare control will be obvious to one skilled in the art.

FIG. 7 represents alternate methods of accomplishing some of the same functions as shown in FIGS. 1 through 6. As in FIG. 1 the original at 1 is imaged on a light sensitive material at 2 when illuminated by light source 3. This image at 2 could be developed "in situ" as in FIGS. 1 and 2 or the light sensitive material could be removed and processed elsewhere. In the latter case a registration device such as registration pins 27 or a 3-way slide, with one rotational movement 28 and two orthoginal movements 29 in a plane perpendicular to the rotational axis, would be required to reposition the image of the processed mask in register with the original at 1 when illuminated by light source 30. It is also possible that the optical system used to produce the mask at 2 need not be the same system as used to image the mask in register with the original at 1. This can be accomplished by providing a method or methods of controlling the image size with elements #7 as in FIG. 1 or adjustments of the position of 2 as indicated by 31. These position adjustments can also control the degree of sharpness for unsharp masking as well as magnification. A diffusion screen or ground glass 32 can be used for receiving the image of 2 at 1 instead of using a field lens to even the illumination for reimaging by lens 33 at 34. Flare control or its equivalent can be accomplished by separately illuminating this screen 32 with controllable light 35, controlled by 36 or other techniques known to one experienced in the art.

Filter 37 FIG. 7 which can be placed anywhere in the system can be used to control the color of the light used for exposing the mask or the color of the light used to produce the final image at 34. One possible place for utilizing a color filter would be at the aperature of lens 4 FIG. 7. In this case a variable filter such as discussed in U.S. Pat. Nos. 2,234,108, 2,354,108 and 3,912,361 could be used.

Other ways of producing single channel flare controlled, sharpness controlled, image registration, photo projection systems will be obvious to one skilled in the art. The following are means which can be combined in various ways to produce the desired effect.

(a) Imaging means—lens conventional or catadioptric.
(b) Contrast or flare control means—filters, diffuse screen at aperture stop, additional light source, variable duffuse aperature, peripheral diffuse aperatures, etc.
(c) Sharpness control means—filters, glass plates, lens focus change
(d) Color control means—filters, dichroic lamphouse, additive color lamphouse
(e) Registration means—registration pins, in-situ development, registration sliders
(f) Means for recording combined image—contact recording, enlarging for prints or transparencies, transparency duplication, optical printer for cinephotography, etc.
(g) In-Situ development means—monobath applicator for conventional film, heat roller for thermal materials such as 3M or Kalvar, amonia cell for Diazo type material, pressure roller for encapsulated processes, charge powder applicator for electrostatic processes, light energy for photochromic processes, etc.

I claim:

1. In an optical printer, projector or image enhancer, comprising means for holding an original cine film or transparency at an image plane, means for holding and illuminating a transparent mask corresponding to the original cine film or transparency and being located at a second corresponding image plane, optical means for imaging this illuminated mask on to the original cine film or transparency at the original image plane, variable veiling glare means cooperating with the optical means for controlling the contrast of the projected mask image upon the original film or transparency, optical and/or mechanical means for registering the mask image with the original film or transparency, and means for recording the combined images contained in and applied to the original film or transparency.

2. A method of optically enhancing and modifying photographic type images comprising the steps of making a transparent mask from or corresponding to an original cine film or transparency to be enhanced or modified, mounting this mask in a holder, illuminating this mask, optically projecting said illuminated mask on to the corresponding original transparency held in a second holder, registering the image of the mask with the original transparency, adjusting the contrast of the projected mask by introducing veiling glare into the optical projection thereof, adjusting the veiling glare to achieve the desired contrast and finally recording the combined images in and applied to the original transparency.

3. In an optical printer, camera projector or image enhancer, comprising means for holding and illuminating an original cine film or transparency at an image plane, optical means for imaging this film or transparency at a second image plane, precise means for removably holding a photosensitive material in the second image plane, means for processing said photosensitive material, second illuminating means for the processed photosensitive material in said precise holding means for projecting back the image on the photosensitive material through the optical means to the original film or transparency, variable veiling glare means cooperating with the optical means for controlling the contrast of the re-projected image upon the original film or transparency, and means for recording the combined images contained in and applied to the original film or transparency.

4. A method of optically enhancing and modifying photographic type images comprising the steps of placing an original transparency having an original image to be enhanced in a holder, illuminating said original transparency, optically projecting the original image to form a second image onto a photo type receptor, exposing the photo type receptor to said image, processing said photo receptor to form a mask, illuminating the processed photo mask so as to project said mask image back through the optical system to fall in register with the original image on the original transparency, adjusting the contrast of this projected mask image by introducing veiling glare into the optical projection thereof, adjusting the amount of flare to achieve the desired contrast, and finally recording the combined images in and applied to the original transparency.

5. A method as set forth in claim 4 in which the processing of the photo receptor is performed in situ without disturbing the position of the second image.

6. In an optical printer, camera projector or image enhancer, comprising means for holding and illuminating an original cine film or transparency at an image plane, optical means for imaging this film or transparency at a second image plane, means for holding a photosensitive material in the second image plane, means for cooperating with said last holding means for exposing and processing the photosensitive material in situ while it is held by the last holding means, second illuminating means for the processed photosensitive material in said last holding means for projecting back the image on the photosensitive material through the optical means to the original film or transparency, variable veiling glare means cooperating with the optical means for controlling the contrast of the re-projected image upon the original film or transparency, and means for recording the combined images contained in and applied to the original film or transparency.

* * * * *